United States Patent
Tanemura et al.

(10) Patent No.: US 9,934,968 B2
(45) Date of Patent: Apr. 3, 2018

(54) METHOD FOR MANUFACTURING P-TYPE ZINC OXIDE FILM

(71) Applicants: NAGOYA INSTITUTE OF TECHNOLOGY, Nagoya-Shi (JP); NGK INSULATORS, LTD., Nagoya-Shi (JP)

(72) Inventors: Masaki Tanemura, Nagoya (JP); Morimichi Watanabe, Nagoya (JP); Jun Yoshikawa, Nagoya (JP); Tsutomu Nanataki, Nagoya (JP)

(73) Assignees: Nagoya Institute of Technology, Nagoya (JP); NGK Insulators, Ltd., Nagoya (JP)

( * ) Notice: Subject to any disclaimer, the term of this patent is extended or adjusted under 35 U.S.C. 154(b) by 0 days.

(21) Appl. No.: 15/346,831

(22) Filed: Nov. 9, 2016

(65) Prior Publication Data

US 2017/0053801 A1 Feb. 23, 2017

Related U.S. Application Data

(63) Continuation of application No. PCT/JP2015/064018, filed on May 15, 2015.

(30) Foreign Application Priority Data

May 16, 2014 (JP) ................................ 2014-102384

(51) Int. Cl.
  *H01L 21/02* (2006.01)
  *C23C 14/32* (2006.01)
  (Continued)

(52) U.S. Cl.
  CPC .... *H01L 21/02554* (2013.01); *C23C 14/0021* (2013.01); *C23C 14/086* (2013.01);
  (Continued)

(58) Field of Classification Search
  CPC .......... H01L 21/02554; H01L 21/0242; H01L 21/02631; H01L 21/02433;
  (Continued)

(56) References Cited

U.S. PATENT DOCUMENTS 7,608,308 B2 * 10/2009 Liu ................... C23C 14/083
  427/586
9,343,310 B1 * 5/2016 Quick ............... H01L 21/02697
  (Continued)

FOREIGN PATENT DOCUMENTS

JP 2004-311702 A 11/2004
JP 2005-068544 A 3/2005
  (Continued)

OTHER PUBLICATIONS

Pathak et al., Effect of doping concentration on the conductivity and optical properties of p-type ZnO thin films, Physica B, 480, 2016, pp. 31-35.*
  (Continued)

Primary Examiner — Earl Taylor
(74) Attorney, Agent, or Firm — Burr & Brown, PLLC

(57) ABSTRACT

There is provided a production method which enables stable formation of a p-type zinc oxide film and also is suitable for enlarging the area of the film. The method for producing a p-type zinc oxide film according to the present invention comprises the steps of: placing a target containing a zinc source and a substrate in a gas atmosphere containing a nitrogen source and an oxygen source and having a gas pressure of 0.1 Pa to 100 Pa, and exposing the target to arc discharge, thereby forming a precursor film containing zinc and oxygen on the substrate; and annealing the precursor film in an oxidizing atmosphere, thereby forming a p-type zinc oxide film.

7 Claims, 1 Drawing Sheet

(51) Int. Cl.
*H01J 37/32* (2006.01)
*C23C 14/08* (2006.01)
*C23C 14/22* (2006.01)
*C23C 14/58* (2006.01)
*C23C 14/00* (2006.01)

(52) U.S. Cl.
CPC ............ *C23C 14/22* (2013.01); *C23C 14/325* (2013.01); *C23C 14/5806* (2013.01); *H01J 37/32055* (2013.01); *H01L 21/0242* (2013.01); *H01L 21/02433* (2013.01); *H01L 21/02579* (2013.01); *H01L 21/02614* (2013.01); *H01L 21/02631* (2013.01); *H01J 2237/332* (2013.01)

(58) Field of Classification Search
CPC ......... H01L 21/02579; H01L 21/02614; C23C 14/325; C23C 14/0021; C23C 14/5806; C23C 14/086; C23C 14/22; H01J 37/32055; H01J 2237/332
See application file for complete search history.

(56) References Cited

U.S. PATENT DOCUMENTS

| | | | | |
|---|---|---|---|---|
| 2007/0108446 | A1* | 5/2007 | Akimoto | H01L 29/41733 257/61 |
| 2009/0302314 | A1* | 12/2009 | Kusumori | C23C 14/086 257/43 |
| 2010/0139762 | A1* | 6/2010 | Ohmi | C23C 16/18 136/256 |
| 2011/0057918 | A1* | 3/2011 | Kimura | G09G 3/3648 345/211 |
| 2012/0205652 | A1* | 8/2012 | Ohmi | H01L 21/0262 257/43 |
| 2017/0053801 | A1* | 2/2017 | Tanemura | C23C 14/086 |
| 2017/0103895 | A1* | 4/2017 | Watanabe | H01L 21/2236 |

FOREIGN PATENT DOCUMENTS

| | | |
|---|---|---|
| JP | 2008-031035 A | 2/2008 |
| JP | 4072620 B | 4/2008 |
| JP | 2008-244387 A | 10/2008 |
| JP | 2010-280941 A | 12/2010 |

OTHER PUBLICATIONS

Lin et al., Properties of nitrogen-implanted p-type ZnO films grown on by radiofrequency magnetron sputtering, Applied Physics Letters, vol. 84, No. 24, 2004, pp. 5040-5042.*

Kirasawa et al., ZnO:Ga conducting-films grown by DC arc-discharge ionplating, Solar Energy Materials & Solar Cells, 67, 2001, pp. 231-236.*

Goldsmith, Filtered vacuum arc deposition of undoped and doped ZnO thin films: Electrical, optical, and structural properties, Surface & Coatings Technology, 201, 2006, pp. 3993-3999.*

Epurescu et al., p-type ZnO thin films grown by RF plasma beam assisted Pulsed Laser Deposition, Superlattices and Microstructures, 42, 2007, pp. 79-84.*

Nagata et al., The effects of Xe on an rf plasma and growth of ZnO films by rf sputtering, Journal of Applied Physics, vol. 95, No. 8, 2004, pp. 3923-3927.*

David et al., p-Type Sb-doped ZnO Thin Films Prepared with Filtered Vacuum Arc Deposition, Proceeding Society of Vacuum Coaters (SVC) 47th Annual Technical Conference, 2005, pp. 27-31. https://arxiv.org/abs/cond-mat/0502150.*

International Search Report and Written Opinion (With English Translation), International Application No. PCT/JP2015/064018, dated Jul. 21, 2015 (15 pages).

Wang, Y.G., et al. "Observations of Nitrogen-Related Photoluminescence Bands From Nitrogen-Doped ZnO Films," *Journal of Crystal Growth*, vol. 252, Issue 1-3, dated 2003, pp. 265-269 (5 pages).

Erdogan, N.H., et al. "Effect of the Oxidation Temperature on Microstructure and Conductivity of $Zn_xN_y$ Thin Films and their Conversion into P-Type ZnO:N Films," *Applied Surface Science*, vol. 271, dated Jan. 20, 2013, pp. 70-76 (7 pages).

* cited by examiner

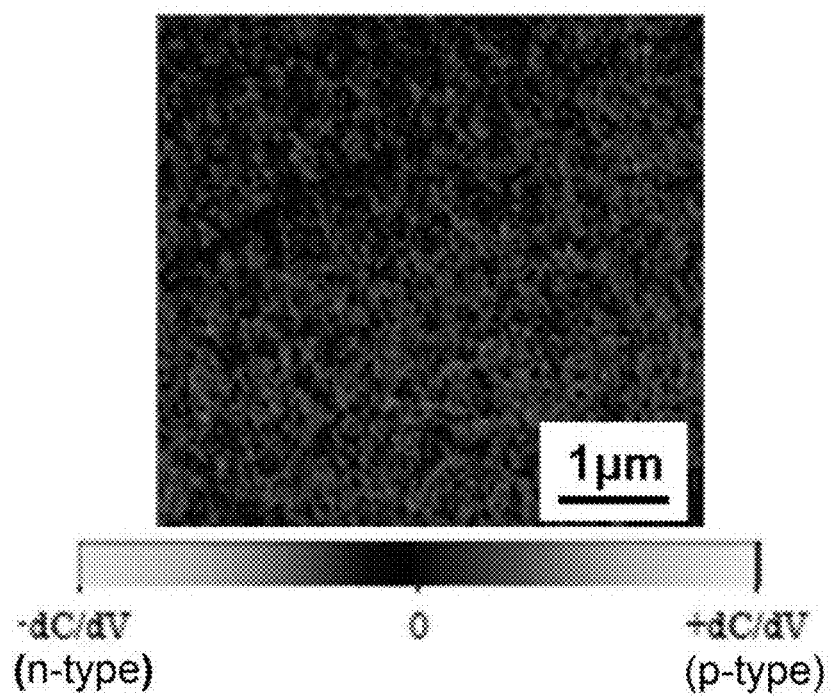

METHOD FOR MANUFACTURING P-TYPE ZINC OXIDE FILM

CROSS-REFERENCE TO RELATED APPLICATIONS

This application is a continuation application of PCT/JP2015/064018 filed May 15, 2015, which claims priority to Japanese Patent Application No. 2014-102384 filed May 16, 2014, the entire contents all of which are incorporated herein by reference.

BACKGROUND OF THE INVENTION

1. Field of the Invention

The present invention relates to a method for producing a p-type zinc oxide film using arc plasma.

2. Description of the Related Art

Zinc oxide (ZnO) has very high possibilities as a safe and inexpensive semiconductor material, but the synthesis of p-type zinc oxide is known to be difficult. Film formation methods through molecular beam epitaxy (MBE), pulse laser deposition (PLD) or the like have hitherto been proposed as methods for producing p-type zinc oxide, but involve the problem of difficulty in forming films having a large area.

On the other hand, methods for synthesizing p-type zinc oxide powder through the use of arc discharge and methods for producing light emitting devices using the same are known. For example, Patent Document 1 (JP4072620B) discloses a method for producing nitrogen-doped p-type zinc oxide ultrafine particles by evaporating zinc using arc discharge in an oxygen-nitrogen gas mixture atmosphere having a gas pressure of, for example, $20 \times 10^3$ Pa. Also, Patent Document 2 (JP2008-244387A) discloses a light emitting device using nitrogen-doped p-type zinc oxide crystal grains, and these p-type zinc oxide crystal grains are also prepared by evaporating zinc using arc discharge in an oxygen-nitrogen gas mixture atmosphere having a gas pressure of, for example, $20 \times 10^3$ Pa.

CITATION LIST

Patent Documents

Patent Document 1: JP4072620B
Patent Document 2: JP2008-244387A

SUMMARY OF THE INVENTION

The p-type zinc oxides disclosed in Patent Documents 1 and 2, however, are in a powder form. The use of p-type zinc oxide in a powder form results, disadvantageously, in preparation of only semiconductor devices having low efficiency. Thus, a method which enables production of p-type zinc oxide in a film form is demanded in order to prepare a semiconductor device having higher efficiency.

The present inventors have found that p-type zinc oxide films, which have hitherto been regarded as being difficult to synthesize, can be stably formed by forming films using arc discharge in a gas atmosphere containing a nitrogen source and an oxygen source and having a gas pressure of 0.1 Pa to 100 Pa, and annealing the resultant films in an oxidizing atmosphere.

An object of the present invention is to provide a production method which enables stable formation of a p-type zinc oxide film and also is suitable for enlarging the area of the film.

According to one embodiment of the present invention, there is provided a method for producing a p-type zinc oxide film, comprising the steps of:

placing a target containing a zinc source and a substrate in a gas atmosphere containing a nitrogen source and an oxygen source and having a gas pressure of 0.1 Pa to 100 Pa, and exposing the target to arc discharge, thereby forming a precursor film containing zinc and oxygen on the substrate; and annealing the precursor film in an oxidizing atmosphere, thereby forming a p-type zinc oxide film.

BRIEF DESCRIPTION OF THE DRAWING

FIG. 1 shows a SCM image (p/n polar image) of a film prepared in Example 1.

DETAILED DESCRIPTION OF THE INVENTION

Definition

The present invention is directed to a method for producing a p-type zinc oxide film. The term "film" used herein means a product in which a constituent (i.e., zinc oxide) merges in a planar manner on a surface of a solid such as a substrate to maintain the shape, or a product in which constituent particles (i.e., zinc oxide particles) are mutually connected in a planar manner on a surface of a solid such as a substrate to hold the shape. In this sense, powder-attached products in which constituent particles are merely attached, in the form of a layer, onto a substrate without being mutually connected cannot be said to be "films." Whether a product is such a "film" can be determined, for example, by immersing a film-formed substrate in a solvent, such as ethanol, in which the film constituent and substrate are insoluble and with which they do not react; drying the substrate; and then determining whether the formed film remains as a film-like residue without any change in state before and after immersion and drying.

Method for Producing P-Type Zinc Oxide Film

In the method for producing a p-type zinc oxide film according to the present invention, a target containing a zinc source and a substrate are firstly located in a gas atmosphere containing a nitrogen source and an oxygen source and having a gas pressure of 0.1 Pa to 100 Pa. Subsequently, the target containing a zinc source is exposed to arc discharge to generate vapor comprising an ion, a neutral species or the like containing a zinc source, thereby forming a precursor film containing zinc and oxygen on the substrate. Then, this precursor film is annealed in an oxidizing atmosphere, thereby forming a p-type zinc oxide film. Film formation methods thorough exposure of the target to arc discharge are generally known, and arc discharge film formation apparatuses are also commercially available. But, the obtainment of p-type zinc oxide films by such methods or apparatuses has never been reported as far as the present inventors know. In fact, both of the p-type zinc oxide crystals reported in Patent Documents 1 and 2 are in a powder form, not in a film form. In this regard, the method according to the present invention enables stable formation of a p-type zinc oxide film which has hitherto been regarded as being difficult to synthesize, through film formation using arc discharge in a gas atmosphere containing a nitrogen source and an oxygen source and having a gas pressure of 0.1 Pa to 100 Pa (which is remarkably lower than the gas pressure of 20×10³ Pa employed in Patent Documents 1 and 2) followed by annealing of the resultant film in an oxidizing atmosphere. Although the mechanism of forming a p-type zinc oxide film by the method of the present invention is unclear, such formation is supposed to be due to nitrogen doping derived from the film formation atmosphere when vapor containing a zinc source and the oxygen source derived from the film formation atmosphere react with each other to form the precursor film on the substrate and/or supplement of oxygen to the precursor film by annealing in the oxidizing atmosphere (this is mere supposition, and the present invention should not be limited to this). The film formation method using this arc discharge also advantageously allows for formation of a p-type zinc oxide film having a large area, as compared with conventional methods such as molecular beam epitaxy (MBE) and pulse laser deposition (PLD).

(1) Formation of Zinc Oxide Film Via Arc Discharge

In the present invention, a target containing a zinc source and a substrate are located in a gas atmosphere containing a nitrogen source and an oxygen source and having a gas pressure of 0.1 Pa to 100 Pa, and the target is exposed to arc discharge to form a film comprising a precursor containing zinc and oxygen, e.g., zinc oxide, on this substrate. The composition of the precursor film may be either zinc oxide which is equivalent or dose to the stoichiometric composition of ZnO or an oxygen-deficient zinc oxide-like composition. This is because, even if the composition is deficient in oxygen, oxygen can be supplemented in the subsequent annealing step.

Arc discharge can be produced by employing known conditions and apparatus, and can generate vapor comprising an ion, a neutral species or the like containing a zinc source from the target. Then, the evaporated vapor comprising a zinc source is deposited, together with the oxygen source derived from the above gas atmosphere, on the substrate, thereby forming a precursor film containing zinc and oxygen. Arc discharge is preferably formed in a vacuum chamber, and it is only necessary to exhaust air from the vacuum chamber until a desired degree of vacuum (for example, $1\times10^8$ Pa to 100 Pa, preferably $1\times10^{-5}$ Pa to 0.1 Pa) is attained and then to introduce the gas atmosphere containing a nitrogen source and an oxygen source. Thus, the pressure of the gas atmosphere containing a nitrogen source and an oxygen source, i.e., 0.1 Pa to 100 Pa, generally constitutes the total pressure of the vacuum chamber during film formation.

The formation of the precursor film using arc discharge is especially preferably conducted by use of an arc plasma gun. The arc plasma gun allows the zinc source-containing vapor generated via arc discharge to be emitted directionally in accordance with the direction of an emission port. Thus, this method enables formation of a good-quality precursor film at a high film formation rate, and is also suitable for enlarging the area of the film. For example, film formation is preferably conducted by attaching an arc plasma gun loaded with the target to a vacuum equipment and extending the emission port of the arc plasma gun into the vacuum chamber of the vacuum equipment.

The atmospheric gas is a gas containing a nitrogen source and an oxygen source, and may be either a multi-component gas (i.e., gas mixture) or a single-component gas (e.g., nitrogen oxide gas) so long as the gas contains nitrogen atoms and oxygen atoms in any forms. A preferred atmospheric gas is a gas mixture of $N_2$ and $O_2$, and can be, for example, atmospheric air. The gas mixture of $N_2$ and $O_2$ has a $N_2/O_2$ ratio of preferably 99/1 to 10/90, more preferably 90/10 to 50/50 on a molar basis.

The pressure of the atmospheric gas ranges from 0.1 Pa to 100 Pa. Such a gas pressure is remarkably lower than the gas pressure of 20×10³ Pa which is exemplified in Patent Documents 1 and 2, and is supposed to contribute to the formation of a good-quality film (not mere deposition of a powdery layer).

The target containing a zinc source serves as a supply source of zinc atoms which can constitute a zinc oxide film, and may be any target containing zinc atoms in such a form that they evaporate upon exposure of the target to arc discharge. Preferred examples of the target containing a zinc source include metal zinc targets, zinc alloy targets and electrically conductive zinc oxide targets. The precursor film is apt to have an oxygen-deficient zinc oxide-like composition, for example, when a metal zinc target is used. However, it is inferred that oxygen would be supplemented to this precursor film in the subsequent annealing step, so that the film would obtain p-type property (this is mere inference, and the present invention should not be limited to this).

The substrate on which the precursor film is to be formed is not particularly limited so long as the substrate is made of any material that does not interfere with the quality of the p-type zinc oxide film (for example, crystallinity and p-type property). Preferred examples of the substrate include sapphire substrates. For example, sapphire substrates having any of plane orientations of a-plane, c-plane, m-plane, r-plane and the like may be used. In the case of the homoepitaxial growth of the p-type zinc oxide film, zinc oxide single crystals and oriented polycrystalline zinc oxide sintered bodies are preferably indicated as examples of the substrate. In the case of the preparation of devices such as light emitting devices and solar cells including pn-junction, on the other hand, a p-type zinc oxide film may be prepared on an n-type zinc oxide film formed on the above substrate. Also in the case of the formation of light emitting devices such as LED, a non-doped zinc oxide film, which can serve as a light emitting layer, may be prepared on the above n-type zinc oxide film, and then a p-type zinc oxide film may be prepared thereon.

(2) Annealing Treatment of Zinc Oxide Film

The resultant precursor film is annealed (thermally treated) in an oxidizing atmosphere, thereby forming a p-type zinc oxide film. This annealing modifies the precursor film to a p-type zinc oxide film. Thus, annealing can be conducted under the conditions that provide a p-type zinc oxide film, and the temperature and time therefor are not particularly limited. Annealing may be conducted at a temperature of preferably 200° C. to 700° C., more preferably 300° C. to 500° C. for a desired time, for example, 1 minute to 5 hours. Also, the oxidizing atmosphere may be any oxidizing gas-containing atmosphere, but is preferably air atmosphere or $O_2$ atmosphere.

The thus finally-obtained film is a p-type zinc oxide film. Whether the resultant zinc oxide film is a p-type film can be determined by acquiring a SCM image (p/n polar image) with a commercial scanning capacitance microscope (SCM). Also, whether the resultant zinc oxide film is a p-type film can be determined by using a commercial thermo-electromotive force measuring instrument. If p-type signals are obtained at a majority of measurement points, it can be determined that the resultant zinc oxide film is a p-type film. For example, when p-type signals are obtained at three of five measurement places, the resultant zinc oxide film can be determined to be a p-type film. Alternatively, other methods such as Hall effect measurement can be used to determine whether the resultant zinc oxide film is a p-type film.

The thickness of the p-type zinc oxide film may appropriately be determined according to the intended use and is not particularly limited, but can preferably be defined as 1 nm or more.

EXAMPLES

The present invention will be described in more detail by way of the following example.

Example 1

A p-type zinc oxide film was prepared on an a-plane sapphire substrate using an arc plasma gun (manufactured by ULVAC, Hyper Arc Plasma Gun ARL-300) (hereinafter abbreviated as "APG") as follows.

Firstly, an a-plane sapphire having a size of 10 mm×10 mm was provided as the substrate, and metal zinc (purity>99%) was provided as the target for APG. The APG loaded with this metal zinc target and the substrate were attached to a vacuum equipment. The vacuum equipment was actuated to exhaust air until the degree of vacuum in a vacuum chamber arrived at about $1 \times 10^{-4}$ Pa. Thereafter, atmospheric air was introduced to a level of 10 Pa, and the APG was actuated under the conditions: voltage: 100V; capacitor unit: 1080 μF; substrate-anode electrode interval: 150 mm; and number of pulses: 25000 pulses to carry out film formation. The thickness of the resultant film was about 200 nm, and the film formation rate was 8 nm/1000 pulses. Incidentally, the film thickness was measured by separately providing a sample formed as a film under the same conditions while partially masking the sample, and measuring the surface profile of this sample using a compact roughness measuring machine (manufactured by Taylor-Hobson, Form Talysurf plus). The thus-formed sapphire substrate was subjected to annealing treatment in air atmosphere at 400° C. for 3.5 hours.

The resultant film, when subjected to qualitative analysis using a sealed tube type X-ray diffractometer (manufactured by Bruker AXS, D8 ADVANCE), was confirmed to be a zinc oxide film. Further, when the film was evaluated using a scanning capacitance microscope (SCM) (manufactured by Bruker AXS, NanoScope IV), a SCM image as shown in FIG. 1 was obtained. From the SCM image shown in FIG. 1, it was confirmed that p-type dC/dV signals were detected from approximately the entire surface of the film, and that a p-type film was formed. Further, in the pn-determination of the film using a thermo-electromotive force measuring instrument (manufactured by NAPSON CORPORATION, thermo-electromotive force measuring instrument PN-12a), p-type signals were acquired at three of five measurement places.

Although pn-determination of the film was conducted using a SCM and a thermo-electromotive force measuring instrument in this Example, other methods such as measurement of Hall effect may be used for evaluation, without any problems.

What is claimed is:

1. A method for producing a p-type zinc oxide film, comprising the steps of:
    placing a target containing a zinc source and a substrate in a gas atmosphere containing a nitrogen source and an oxygen source and having a gas pressure of 0.1 Pa to 100 Pa, and exposing the target to arc discharge, thereby forming a precursor film containing zinc and oxygen on the substrate; and
    annealing the precursor film in an oxidizing atmosphere, thereby forming a p-type zinc oxide film.

2. The method according to claim 1, wherein the formation of the precursor film using the arc discharge is conducted using an arc plasma gun.

3. The method according to claim 1, wherein the target is a metal zinc target.

4. The method according to claim 1, wherein the gas containing a nitrogen source and an oxygen source is a gas mixture of $N_2$ and $O_2$.

5. The method according to claim 4, wherein the gas mixture is atmospheric air.

6. The method according to claim 1, wherein the annealing is conducted at a temperature ranging from 200° C. to 700° C.

7. The method according to claim 1, wherein the oxidizing atmosphere is air atmosphere or $O_2$ atmosphere.

* * * * *